United States Patent
Blanchard

(10) Patent No.: US 9,099,568 B2
(45) Date of Patent: Aug. 4, 2015

(54) THREE-TERMINAL PRINTED DEVICES INTERCONNECTED AS CIRCUITS

(71) Applicant: Nthdegree Technologies Worldwide Inc., Tempe, AZ (US)

(72) Inventor: Richard Austin Blanchard, Los Altos, CA (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/204,886

(22) Filed: Mar. 11, 2014

(65) Prior Publication Data

US 2014/0264460 A1    Sep. 18, 2014

Related U.S. Application Data

(60) Provisional application No. 61/785,357, filed on Mar. 14, 2013.

(51) Int. Cl.
*H01L 21/84*  (2006.01)
*H01L 25/00*  (2006.01)
(Continued)

(52) U.S. Cl.
CPC ............... *H01L 21/84* (2013.01); *H01L 24/24* (2013.01); *H01L 24/25* (2013.01); *H01L 24/82* (2013.01); *H01L 24/95* (2013.01); *H01L 24/97* (2013.01); *H01L 25/072* (2013.01); *H01L 25/50* (2013.01); *H01L 27/12* (2013.01); *H01L 24/05* (2013.01); *H01L 24/06* (2013.01); *H01L 24/32* (2013.01); *H01L 24/73* (2013.01); *H01L 24/92* (2013.01); *H01L 25/0655* (2013.01); *H01L 25/0753* (2013.01); *H01L 2221/68381* (2013.01);
(Continued)

(58) Field of Classification Search
CPC ......... H01L 24/95; H01L 24/97; H01L 24/82; H01L 24/25; H01L 24/24; H01L 21/84; H01L 25/0655; H01L 25/072; H01L 25/50; H01L 25/00; H01L 25/07; H01L 2224/82104; H01L 2224/92244; H01L 2924/13
USPC .......... 438/107, 127, 128, 121, 142; 257/202, 257/E21.705
See application file for complete search history.

(56) References Cited

U.S. PATENT DOCUMENTS 6,331,063 B1 * 12/2001 Kamada et al. ............... 362/237
7,972,031 B2 * 7/2011 Ray et al. .................. 362/249.02
(Continued)

OTHER PUBLICATIONS

PCT/US14/26127 filed Mar. 13, 2014, "International Search Report and Written Opinion" dated Jul. 17, 2014, 11 pages.

*Primary Examiner* — Michael Trinh
(74) *Attorney, Agent, or Firm* — Patent Law Group LLP; Brian D. Ogonowsky

(57) ABSTRACT

A layer of microscopic, 3-terminal transistors is printed over a first conductor layer so that bottom electrodes of the transistors electrically contact the first conductor layer. A first dielectric layer overlies the first conductor layer, and a second conductor layer over the first dielectric layer contacts intermediate electrodes on the transistors between the bottom electrodes and top electrodes. A second dielectric layer overlies the second conductor layer, and a third conductor layer over the second dielectric layer contacts the top electrodes. The devices are thus electrically connected in parallel by a combination of the first conductor layer, the second conductor layer, and the third conductor layer. Separate groups of the devices may be interconnected to form more complex circuits. The resulting circuit may be a very thin flex-circuit.

27 Claims, 4 Drawing Sheets

(51) Int. Cl.
    *H01L 27/12*     (2006.01)
    *H01L 23/00*     (2006.01)
    *H01L 25/07*     (2006.01)
    *H01L 25/065*     (2006.01)
    *H01L 25/075*     (2006.01)

(52) U.S. Cl.
    CPC ............. *H01L2224/05552* (2013.01); *H01L 2224/05555* (2013.01); *H01L 2224/06051* (2013.01); *H01L 2224/06181* (2013.01); *H01L 2224/24137* (2013.01); *H01L 2224/25105* (2013.01); *H01L 2224/25174* (2013.01); *H01L 2224/32225* (2013.01); *H01L 2224/73267* (2013.01); *H01L 2224/82104* (2013.01); *H01L 2224/92244* (2013.01); *H01L 2224/95085* (2013.01); *H01L 2224/95101* (2013.01); *H01L 2224/95115* (2013.01); *H01L 2224/95144* (2013.01); *H01L 2224/95145* (2013.01); *H01L 2924/10253* (2013.01); *H01L 2924/12041* (2013.01); *H01L 2924/1301* (2013.01); *H01L 2924/1305* (2013.01); *H01L 2924/13034* (2013.01); *H01L 2924/13062* (2013.01); *H01L 2924/13091* (2013.01)

(56) References Cited

U.S. PATENT DOCUMENTS

| | | | |
|---|---|---|---|
| 2007/0040489 A1* | 2/2007 | Ray et al. | 313/310 |
| 2012/0164796 A1* | 6/2012 | Lowenthal et al. | 438/127 |
| 2012/0164797 A1* | 6/2012 | Lowenthal et al. | 438/127 |
| 2013/0221368 A1* | 8/2013 | Oraw | 257/76 |

\* cited by examiner

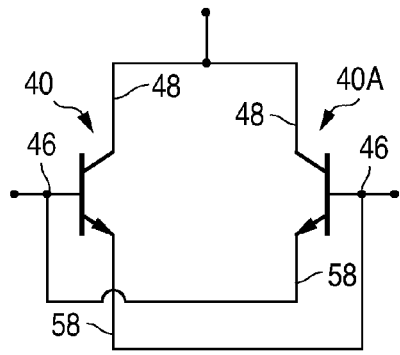 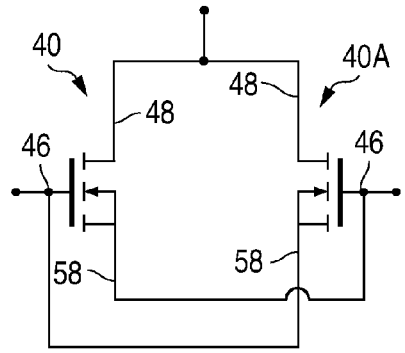
FIG. 9     FIG. 10
|  | MOS | BIPOLAR |
|---|---|---|
| TOP | GATE | EMITTER |
| INTERMEDIATE | SOURCE BODY | BASE |
| BOTTOM | DRAIN | COLLECTOR |
| EFFECT IF UPSIDE DOWN | GATE IS BOTTOM CONTACT. THEREFORE, AN OPEN CIRCUIT. | COLLECTOR AND EMITTER REVERSED WITH BASE FLOATING. REVERSE BIASED DIODE. |
FIG. 11
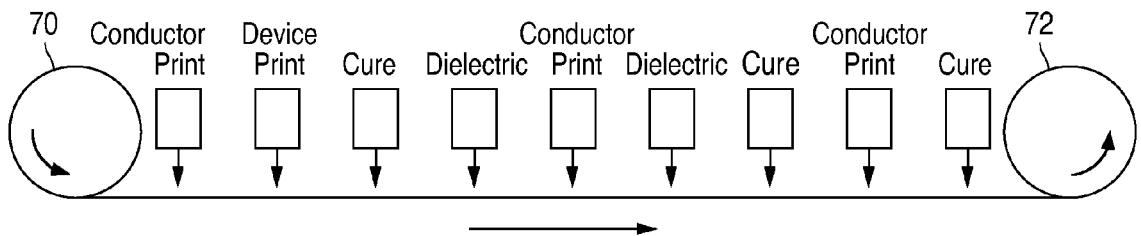
FIG. 12

THREE-TERMINAL PRINTED DEVICES INTERCONNECTED AS CIRCUITS

CROSS-REFERENCE TO RELATED APPLICATIONS

This application is based on U.S. provisional application Ser. No. 61/785,357, filed Mar. 14, 2013, by Richard Austin Blanchard, assigned to the present assignee and incorporated herein by reference.

FIELD OF THE INVENTION

This invention relates to printing pre-formed microscopic 3-terminal devices such as transistors or other circuits.

BACKGROUND

It is known, by the present assignee's own work, how to form and print microscopic 2-terminal vertical light emitting diodes (LEDs), with the proper orientation, on a conductive substrate and connect the LEDs in parallel. Details of such printing of LEDs can be found in US application publication US 2012/0164796, entitled, Method of Manufacturing a Printable Composition of Liquid or Gel Suspension of Diodes, assigned to the present assignee and incorporated herein by reference.

FIG. 1 is a cross-sectional view of a layer of LEDs 16 that may be printed using the following process. Each LED 16 includes standard semiconductor GaN layers, including an n-layer, and active layer, and a p-layer.

An LED wafer, containing many thousands of vertical LEDs, is fabricated so that the bottom metal cathode electrode 18 for each LED 16 includes a reflective layer. The top metal anode electrode 20 for each LED 16 is small to allow almost all the LED light to escape the anode side. A carrier wafer, bonded to the "top" surface of the LED wafer by an adhesive, may be used to gain access to both sides of the LED for metallization. The LEDs 16 are then singulated, such as by etching trenches around each LED down to the adhesive layer and dissolving the exposed wafer-bonding adhesive layer or by thinning the carrier wafer.

The microscopic LEDs are then uniformly infused in a solvent, including a viscosity-modifying polymer resin, to form an LED ink for printing, such as screen printing, or flexographic printing.

If it is desired for the anode electrodes 20 to be oriented in a direction opposite to the substrate 22 after printing, the electrodes 20 are made tall so that the LEDs 16 are rotated in the solvent, by fluid pressure, as they settle on the substrate surface. The LEDs 16 rotate to an orientation of least resistance. Over 90% like orientation has been achieved.

In FIG. 1, a starting substrate 22 is provided. If the substrate 22 itself is not conductive, a reflective conductor layer 24 (e.g., aluminum) is deposited on the substrate 22 such as by printing.

The LEDs 16 are then printed on the conductor layer 24 such as by screen printing with a suitable mesh, or by flexography, to control the thickness of the layer. Because of the comparatively low concentration, the LEDs 16 will be printed as a monolayer and be fairly uniformly distributed over the conductor layer 24.

The solvent is then evaporated by heat using, for example, an infrared oven. After curing, the LEDs 16 remain attached to the underlying conductor layer 24 with a small amount of residual resin that was dissolved in the LED ink as a viscosity modifier. The adhesive properties of the resin and the decrease in volume of resin underneath the LEDs 16 during curing press the bottom LED electrode 18 against the underlying conductor 24, making ohmic contact with it.

A dielectric layer 26 is then printed over the surface to encapsulate the LEDs 16 and further secure them in position.

A top transparent conductor layer 28 is then printed over the dielectric layer 26 to electrically contact the electrodes 20 and cured in an oven appropriate for the type of transparent conductor being used.

Metal bus bars 30-33 are then printed along opposite edges of the conductor layers 24 and 28 and electrically terminate at anode and cathode leads (not shown), respectively, for energizing the LEDs 16. The bus bars 30-33 will ultimately be connected to a positive or negative driving voltage.

FIG. 2 is a top down view of FIG. 1. The cross-section of FIG. 2 is a horizontal bisection of FIG. 3.

If a suitable voltage differential is applied to the anode and cathode leads, all the LEDs 16 with the proper orientation will be illuminated. FIG. 1 shows a light ray 38.

The above process is strictly for use with 2-terminal devices having a top electrode and a bottom electrode, since the locations of the LEDs on the substrate are random, and the LEDs can only be interconnected by sandwiching the LEDs between two conductive layers of any thickness.

It would be desirable to adapt the above-described process to create printed electrical circuits other than vertical LEDs connected in parallel. Many types of electrical components use three terminals, such as MOSFETs, bipolar transistors, JFETs, thyristors, silicon controlled rectifiers, etc. Such components typically have three terminals on the top, for lateral devices, or two terminals on top and one on the bottom, for vertical devices. It is known to form thin film transistors by printing the various transistor layers over a substrate, but the performance of such transistors is poor due to the difficulty of printing a single crystal. If transistors (or other 3-terminal devices) could be more conventionally formed in a semiconductor wafer and then singulated to create microscopic devices for printing as an ink, the quality of the devices may be state of the art. However, heretofore it is not known how to design such devices or to interconnect such 3-terminal microscopic devices after printing.

SUMMARY

In one embodiment, a semiconductor wafer of 3-terminal devices, such as transistors, is formed. The transistors may be silicon based. The devices are formed in the wafer to have a bottom electrode, a top electrode, and an intermediate electrode that is located on a shelf somewhere between the top and bottom of the device. The starting wafer (e.g., silicon) is ultimately affixed to a carrier wafer, by an adhesive, to gain access to both surfaces of the devices when fabricating them.

The devices are singulated into individual devices by forming trenches around each device, such as to form hexagonal devices. The trenches extend down to the adhesive layer, and the adhesive layer is dissolved in a solution, releasing all the devices from the carrier wafer.

The devices are then uniformly mixed into a solution to form an ink. The shapes of the devices cause a vast majority them to be printed in the desired orientation on a substrate.

The devices are then printed on a conductor layer over a substrate, and the ink is cured (heated and evaporated), so that the bottom electrodes make ohmic contact with this first conductor layer. The devices will be printed as a monolayer due to the relatively low density of the devices in the solution.

In all printing steps, the printing may be by screen printing or by flexography. Flexography is more conducive to a roll-to-roll process.

A first dielectric layer is then printed over the first conductor layer. The first dielectric layer does not cover the intermediate electrode. A second conductor layer is then printed, which contacts the intermediate electrode but does not cover the top electrode. The various thin printed layers self-planarize by a strong surface tension so that the layer does not cover any features "above" the thickness of the layer. Alternatively, the layers may be blanket etched after curing to expose any electrodes.

A second dielectric layer is then printed over the second conductor layer but not over the top electrode. A third or top conductor layer is then printed to contact the top electrode of the device.

Therefore, the top electrodes of the devices are connected in parallel, the bottom electrodes are connected in parallel, and the intermediate electrodes (or a subset of them) are connected in parallel for conducting a wide range of currents.

Metal bus bars may then be printed to contact one or more of the three conductor layers, and the layers are coupled to suitable operating voltages and control voltages.

The functions of the three electrodes are selected such that, if some of the devices are printed upside down or make a poor connection, there is no adverse effect on the functions of the proper orientated devices.

Different areas of the substrate may be printed with different devices or the same devices, and the devices in each area are connected in parallel. The various areas may be interconnected by printed traces to form circuits. Such circuits may form logic gates or switchable LEDs, or more complex circuits.

In another embodiment, two electrodes are formed on the top surface of the devices and one electrode is formed on the bottom surface. A metal fin on the top of the devices allows the rotational orientation of the devices to be controlled, prior to curing, using an electric or magnetic field. The devices are printed in a narrow strip using a hydrophobic mask during printing so that the devices are printed in a line. A bottom conductor layer contacts the bottom electrode, and two printed, planar conductor layers contact the two electrodes on top.

The printing process may use a roll-to-roll process at atmospheric pressures.

Other embodiments are disclosed.

BRIEF DESCRIPTION OF THE DRAWINGS

FIG. 1 is taken across a horizontally bisected FIG. 2.

FIGS. 9 and 10 illustrate how some transistors may be "incorrectly" interconnected by improper orientations of the transistors when printing, where the interconnections do not adversely affect the functions of the properly oriented transistors.

FIG. 11 is a chart identifying preferred functions of the top, bottom, and intermediate electrodes for MOSFETs and bipolar transistors.

FIG. 12 illustrates a roll-to-roll process that may be used to form the circuits.

Elements that are similar or identical in the various figures are labeled with the same numeral.

DETAILED DESCRIPTION

The 3-terminal devices used in embodiments of the present invention may be less than the diameter of a human hair, rendering them essentially invisible to the naked eye when the devices are sparsely spread across a substrate. The sizes of the devices may range from about 10-200 microns across. The number of micro-devices per unit area may be freely adjusted when applying the micro-devices to the substrate. The devices may be printed as an ink using screen printing, flexography, or other forms of printing. Conventional designs for 3-terminal devices may be easily adapted for forming the micro-devices of the present invention. The precision of photolithography is well within the precision needed to form the micro-devices. Since many of the micro-devices will be operating in parallel, the efficiency of each micro-device is not critical.

Figure 3:
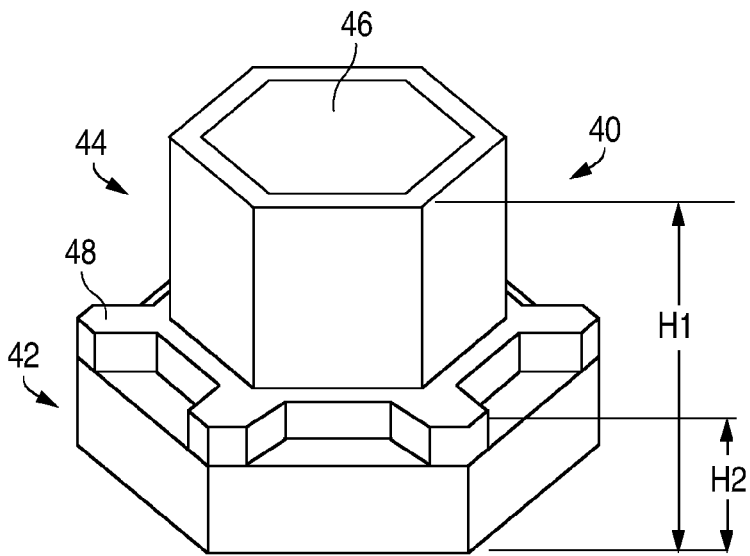
FIG. 3 is a perspective view of a single 3-terminal transistor that has been singulated from a wafer, in accordance with one embodiment of the invention. The device is mixed into a solution to form an ink for printing on a substrate.

FIG. 3 is a perspective view of a 3-terminal device 40 that can be suspended in a solvent and printed as an ink on a substrate. The device 40 may be a bipolar transistor, a MOSFET, a JFET, a tri-MOS device, or any other 3-terminal device, generally including two current carrying terminals and a control terminal. The devices can be lateral or vertical transistors, since the positions of the three electrodes do not dictate the locations of the semiconductor layers/regions or gates in the devices. The electrodes may contact any location in the device using vias.

The devices 40 are completely formed on a semiconductor wafer, including the electrode metallizations, by using one or more carrier wafers during the processing to gain access to both surfaces for metallization. Although the growth wafer may be silicon, the carrier wafer may be any material. The silicon wafer is affixed to the carrier wafer using an adhesive. The shape of each device 40 is defined by masking and etching. Various layers or regions may be doped using masked implantation or by doping the layers while being epitaxially grown. After the devices are formed on the wafer, trenches are photolithographically defined and etched in the front surface of the wafer around each device down to the adhesive layer. A preferred shape of each device 40 is hexagonal. The trench etch exposes the underlying wafer bonding adhesive. The adhesive is then dissolved in a solution to release the devices 40 from the carrier wafer. Singulation may instead be performed by thinning the back surface of the carrier wafer until the devices 40 are singulated. The microscopic devices 40 are then uniformly infused in a solvent, including a viscosity-modifying polymer resin, to form an ink for printing, such as screen printing or flexographic printing.

Details regarding shaping vertical LEDs (2-terminal devices) in a wafer and then singulating the LEDs for printing as an ink are described in US application publication US 2012/0164796, entitled, Method of Manufacturing a Printable Composition of Liquid or Gel Suspension of Diodes, assigned to the present assignee and incorporated herein by reference. One skilled in the art may adapt such processes for forming the 3-terminal device 40.

The device 40 has two sections: a lower section 42 (or base portion) and an upper section 44. The upper section 44 is made relatively tall and narrow so that the devices 40 are rotated in the solvent, by fluid pressure, as they settle on the substrate surface. The devices 40 rotate to an orientation of least resistance. Over 90% like orientation has been achieved, although satisfactory performance may be achieved with over 75% of the devices 40 being in the same orientation.

Figure 4:
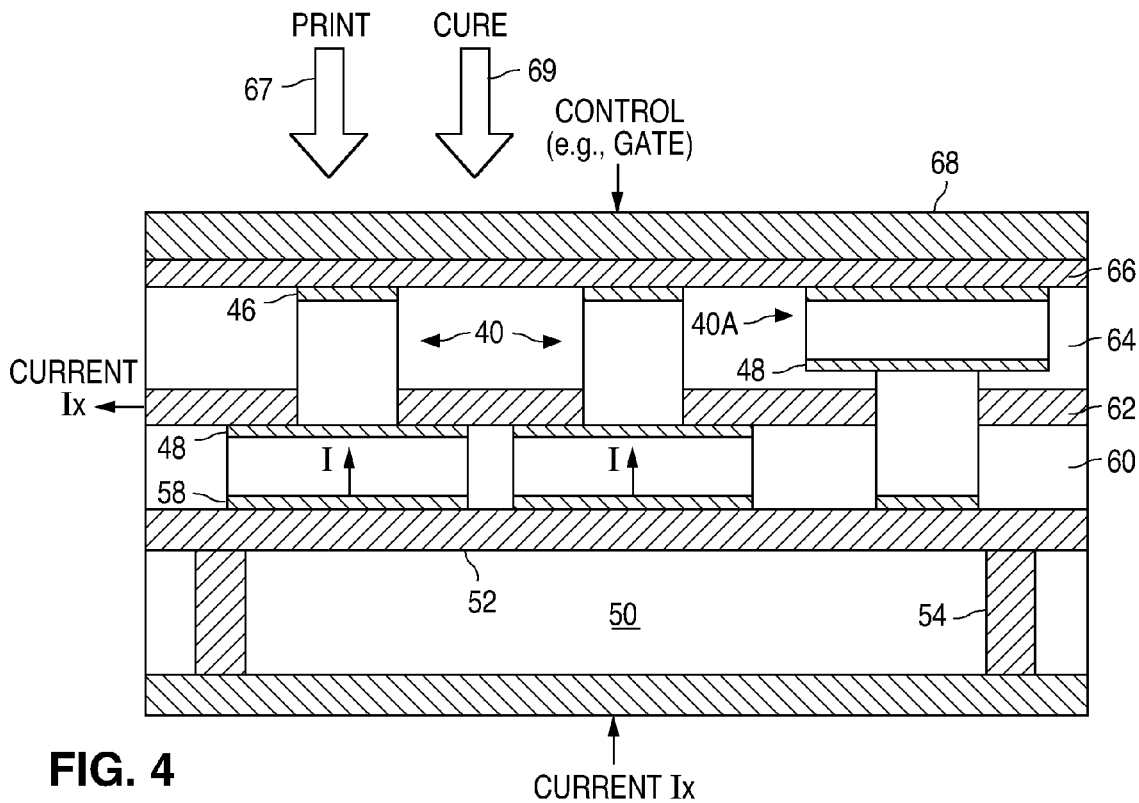
FIG. 4 is a cross-section of a small portion of a printed layer of the transistors connected in parallel using three planes of conductor layers.

The lower section 42 should be shaped so that the device 40 sits flat on the substrate after the ink is cured. FIG. 4 illustrates three printed devices 40, where only two are printed with the correct orientation.

The device 40 includes a metal top electrode 46, a metal intermediate electrode 48, and a metal bottom electrode (not shown in FIG. 3). The shape of the intermediate electrode 48 provides a large side surface area for good electrical contact with an intermediate conductor layer.

The intermediate electrode 48 should be offset with respect to the middle of the device 40 so that an improper orientation of the device 40 after printing results in the intermediate electrode 48 not electrically contacting the intermediate conductor layer. In the example, the intermediate electrode 48 is below the middle of the device 40 (i.e., $H2 < \frac{1}{2}H1$).

In FIG. 4, a starting substrate 50 is provided. The substrate 50 is preferably thin and flexible for light weight, low cost, good heat conduction to air or a heat sink, and ease of processing. The substrate 50 may be a suitable polymer, such as polycarbonate, PMMA, or PET, and may be flexible so as to be dispensed from a roll. The substrate 50 can be any size suitable for the ultimate product. The substrate 50 may be a conventional flex-circuit substrate, where metal (e.g., copper) traces have been already formed on the substrate 50 by conventional means prior to the below processing steps.

If the substrate 50 itself is not conductive or does not already have metal traces formed on it as a flex-circuit, a conductor layer 52 (e.g., aluminum) is deposited on the substrate 50 such as by printing. Conductive vias 54 through the substrate 50 may be used to couple the conductor layer 52 to a metal layer 56 formed on the bottom surface of the substrate 50.

The devices 40 are then printed on the conductor layer 52 such as by screen printing with a suitable mesh, or by flexography, to control the thickness of the layer. Because of the comparatively low concentration, the devices 40 will be printed as a monolayer and be fairly uniformly distributed over the conductor layer 52.

The solvent is then evaporated by heat using, for example, an infrared oven. After curing, the devices 40 remain attached to the underlying conductor layer 52 with a small amount of residual resin that was dissolved in the ink as a viscosity modifier. The adhesive properties of the resin and the decrease in volume of resin underneath the devices 40 during curing press the bottom electrode 58 against the underlying conductor layer 52, making ohmic contact with it.

A thin dielectric layer 60 is then printed over the surface to cover the conductor layer 52 and further secure the devices 40 in position. The dielectric layer 60 is designed to self-planarize during curing, by surface tension, so as to pull off of the top electrode 46 and the intermediate electrode 48. Therefore, etching the dielectric layer 60 is not required. If the dielectric layer 60 covers the electrodes 46/48, then a blanket etch may be used to expose the electrodes 46/48.

An intermediate conductor layer 62 is then printed over the dielectric layer 60 to electrically contact the intermediate electrode 48 and is cured in an oven appropriate for the type of conductor being used. The various conductor layers may be metal (or contain metal) or be any other type of printable conductor layer.

Another thin dielectric layer 64 is printed over the intermediate conductor layer 62 so as not to cover the top electrode 46.

A top conductor layer 66 is then printed over the dielectric layer 64 to electrically contact the top electrode 46 and is cured in an oven appropriate for the type of conductor being used.

A thicker metal layer 68 may then be printed over the conductor layer 66 for improving electrical conductivity and/or heat conduction. The intermediate conductor layer 62 may be contacted by a metal bus bar near an exposed edge.

Figure 1:
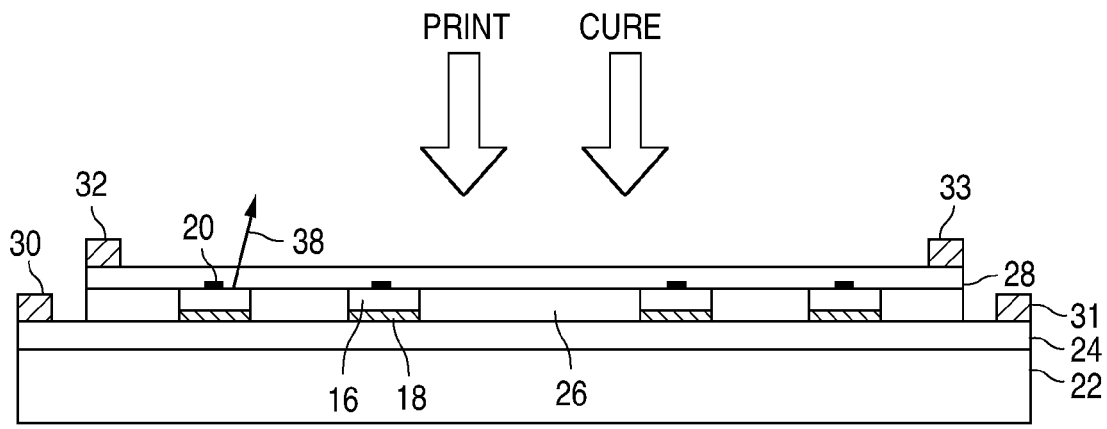
FIG. 1 is a cross-section of a monolayer of printed, microscopic vertical LEDs that may be formed using the assignee's prior art process.
Figure 2:
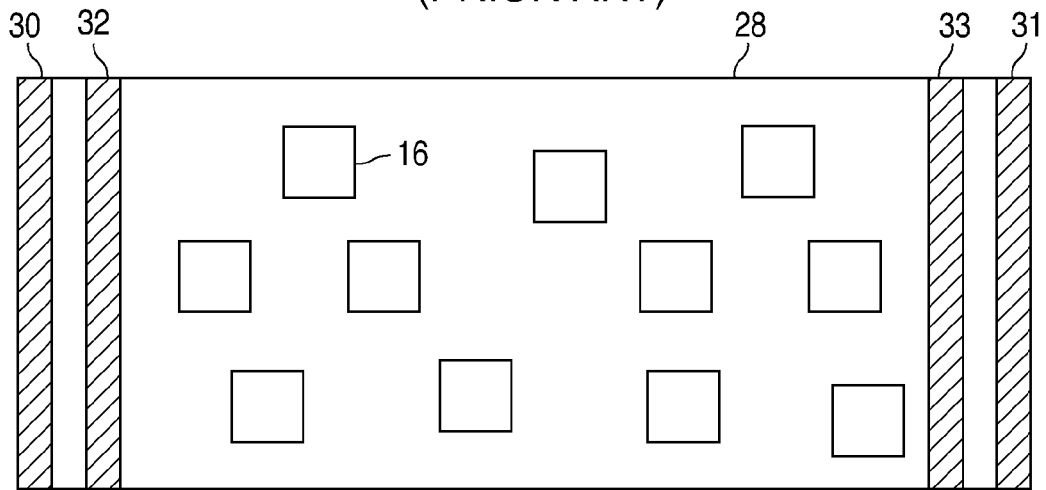
FIG. 2 is a top down view of the structure of FIG. 1, where

FIG. 4 illustrates that the only steps needed to form the structure of FIG. 4 are printing and curing steps 67 and 69. The random pattern of the devices 40 may resemble the pattern of LED 16 in FIG. 2.

FIG. 4 illustrates that the rightmost device 40A is oriented in the opposite direction. However, the intermediate electrode 48 is left floating, so the device 40A does not operate and has no effect on the resulting circuit.

The printed devices 40 are connected in parallel by the conductor layers. Suitable operating voltages and control voltages are applied to the conductor layers to operate the devices 40. In the example of FIG. 4, the top electrode 46 is the control electrode for the devices 40 (e.g., for gates or bases). The remaining two electrodes are the current carrying electrodes (e.g., source/drain, emitter/collector). Since the intermediate electrode 48 of the improperly oriented device 40A is floating, the device 40 remains off and an open circuit.

Figure 5:
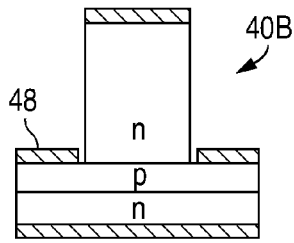
FIG. 5 illustrates how the transistor of FIG. 4 may be an npn bipolar transistor.

FIG. 5 illustrates how the device 40 may be an npn bipolar transistors 40B, where the intermediate electrode 48 is the base electrode. The intermediate electrode 48 may be connected to any of the other semiconductor layers in the device 40B using a via.

Figure 6:
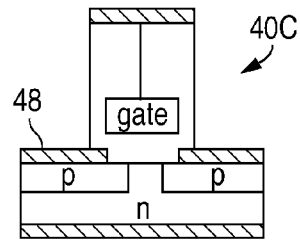
FIG. 6 illustrates how the transistor of FIG. 4 may be a p-channel MOSFET.

FIG. 6 illustrates how the device 40 may be a p-channel MOSFET 40C, where the intermediate electrode 48 is the source electrode. The intermediate electrode 48 may be connected to any of the other layers in the device 40C using a via.

Figure 7:
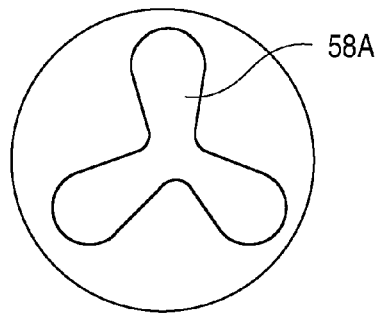
FIGS. 7 and 8 are some examples of metal designs on the bottom surface of the transistors that increase the reliability of the electrical connection and ensure the transistors will be supported substantially vertically on the bottom conductor layer.
Figure 8:
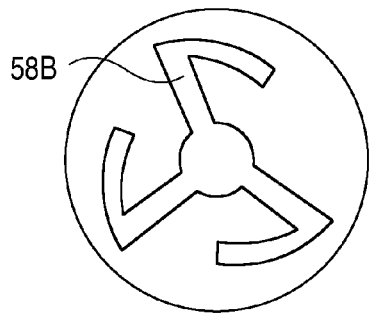

FIGS. 7 and 8 illustrate possible patterns of the metal bottom electrodes 58A and 58B. Such patterns form a good electrical connection to the conductor layer 52 and, since the electrodes have three "legs," the electrodes 58A and 58B will lay flat on the conductor layer 52 for a good electrical connection.

Any number of the devices 40 may be connected in parallel for handling a wide range of currents. Small groups of the devices 40 may be printed in separate regions on the substrate 50, and the various conductor layers may be patterned so that the devices 40 in each group are connected in parallel, but each group is electrically isolated from one another. Therefore, each group forms a separate component. The selective printing of any of the layers may be by screen printing, where a mask on the screen mesh determines the deposition, or by flexography, where a pattern on a rolling plate determines the deposition. The groups may then be selectively interconnected using "programming" conductor traces on the substrate 50 to form more complex circuits, such as logic circuits. A metal flex-circuit pattern on the substrate 50 may be used to interconnect the groups of devices 40 for form the logic circuits.

FIG. 9 illustrates how the improper orientation of the device 40A in FIG. 4 does not adversely affect the operation of the properly oriented devices 40 connected in parallel. The device 40/40A is assumed to be an npn bipolar transistor with a top electrode 46 for the base, a bottom electrode 58 for the emitter, and an intermediate electrode 48 for the collector. Since the device 40A is undesirably oriented upside down during printing (shown in FIG. 4), its base is shorted to the emitter of the device 40 and its emitter is shorted to the base of the device 40. When the base/emitter junction of the device 40 is forward biased to turn on the device 40, the device 40A remains off and has no effect on the operation of the device 40. Note that, by using an intermediate electrode 48 that is offset from the middle of the device 40 (as shown in FIGS. 3 and 4), the intermediate electrode 48 of the device 40A would be floating, making its effect even more insignificant.

FIG. 10 is similar to FIG. 9 but the devices 40 and 40A are MOSFETs.

FIG. 11 is a table showing possible connections for the top, bottom, and intermediate electrodes of the device 40 formed as a MOSFET or a bipolar transistor so that improper orientations do not adversely affect the functions of the properly oriented devices 40 connected in parallel.

FIG. 12 schematically illustrates one possible assembly line for manufacturing the circuits by printing in a roll-to-roll process. The roll 70 contains the substrate material, and the roll 72 is a take-up roll. The various stations are labeled. In the example used to form the embodiment of FIG. 4, the process sequentially prints the various layers and cures the layers. Similar roll-to-roll processes, performed under atmospheric conditions, may be used to form the other embodiments.

Figure 13:
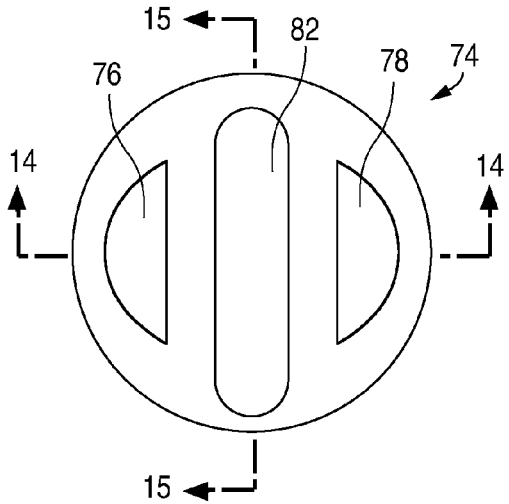
FIG. 13 is a top down view of another 3-terminal transistor having two terminals on top, where a projecting fin is used to achieve the proper rotational orientation of the transistor, in accordance with another embodiment of the invention.
Figure 14:
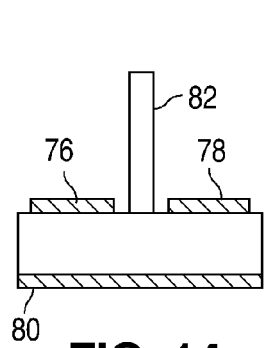
FIG. 14 is a cross-sectional view of the transistor of FIG. 13 along line 14-14.
Figure 15:
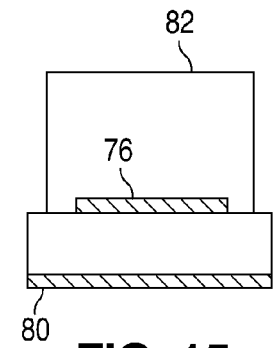
FIG. 15 is a cross-sectional view of the transistor of FIG. 13 along line 15-15.
Figure 16:
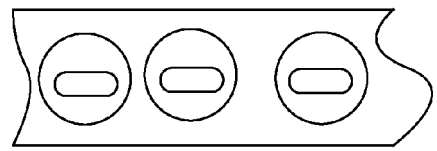
FIG. 16 illustrates the transistors of FIG. 13 being properly oriented on a substrate after printing.
Figure 17:
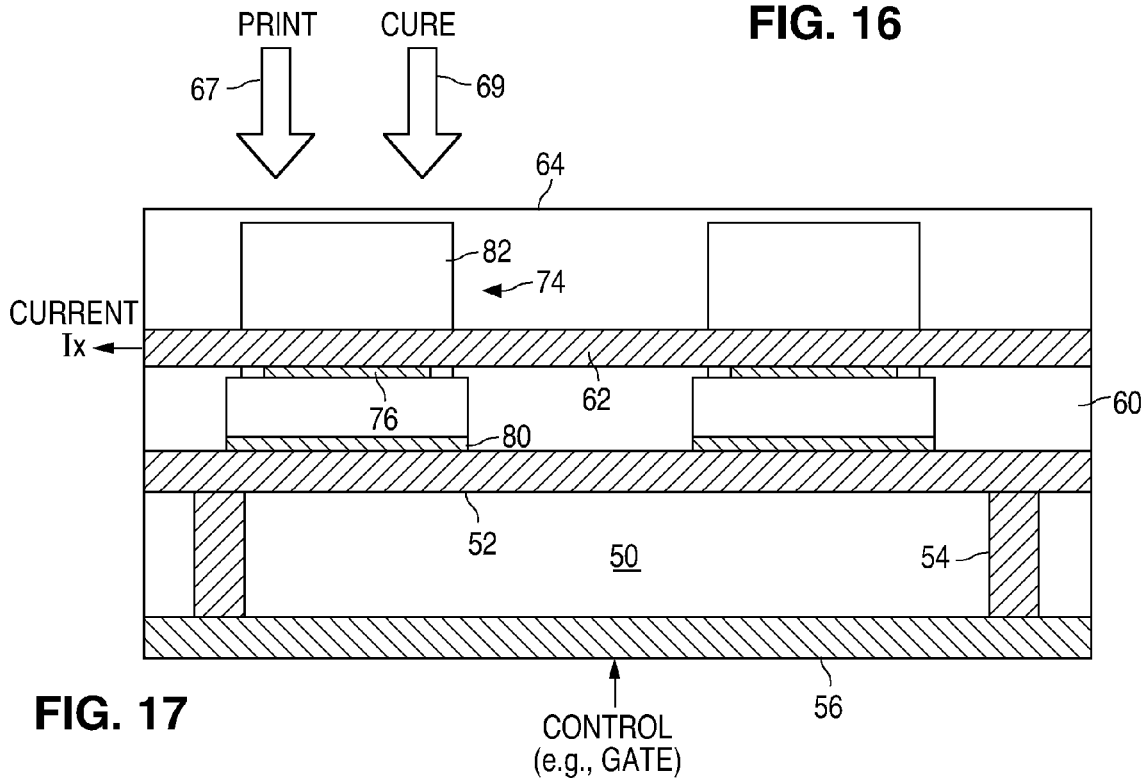
FIG. 17 is a cross-section of a small portion of a printed layer of the transistors of FIG. 16 connected in parallel using two planes of conductor layers.

FIGS. 13-17 illustrate another embodiment of the invention, where there are only two levels of conductor layers, and the 3-terminal device 74 has two electrodes 76/78 on its top surface and one electrode 80 on its bottom surface. The device 74 has a fin 82, such as formed of metal or a magnet, which causes the devices 74 to be properly oriented on the substrate 50 (FIG. 16) after printing. FIG. 14 is a cross-sectional view along line 14-14 in FIG. 13, and FIG. 15 is a cross-sectional view along line 15-15 in FIG. 13. The fin 82 is also affected by an electric field 84 (FIG. 16) that is applied prior to the curing of the ink to impart a rotational force to the devices 74 until they have the same rotational orientation, as shown in FIG. 16. The field may instead be a magnetic field.

The devices 74 are preferably formed so that their performance is symmetrical about the fin 82, meaning that the functions of the electrodes 76 and 78 are identical. For example, the electrodes 76 and 78 may contact identical p-type regions (drain and source depending on the polarity) in an n-channel MOSFET, and the bottom electrode 80 may be the gate electrode.

The devices 74 are printed in a linear line, shown in FIG. 16, by a hydrophobic mask that is patterned on the substrate 50. The hydrophobic mask only allows the ink to reside in a very narrow opening in the mask. Since the devices 74 are fairly sparsely distributed in the ink, the printed devices 74 form a line.

To form a circuit using the devices 74, the bottom conductor layer 52 is printed, followed by the printing, aligning, and curing of the devices 74. The dielectric layer 60 is then printed. The conductor layer 62 is printed using a patterned hydrophobic mask so that the parallel conductor layer strips for contacting the top electrodes 76/78 are physically separated. The devices 74 are thus connected in parallel. The top dielectric layer 64 is then printed. The operating voltages and control voltage are then applied to the conductors. The circuit of FIG. 17 may thus be formed by printing and curing steps 67 and 69 in a roll-to-roll process.

The embodiments of FIGS. 13-17 are particularly useful for low current circuits such as programmable gate arrays, where small groups of the devices 74 are programmably interconnected using a metal mask to perform logic functions.

The various directional attributes used herein, such as bottom, top, and vertical, are not to be construed to convey absolute directions relative to the Earth's surface but are used to convey orientations relative to the enclosed figures when the drawing sheets are held upright. In an actual embodiment, such terms still apply to the product regardless of the absolute orientation of the product relative to the Earth's surface.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a circuit comprising:
providing an ink containing a plurality of pre-formed, 3-terminal semiconductor electrical devices mixed in a solvent, thereby producing an ink, each of the devices having a first electrode, a second electrode, and a third electrode;
providing a substrate having a first conductor layer;
depositing the ink over the first conductor layer;
curing the ink to form a layer of the devices having the first electrode electrically connected to the first conductor layer;
depositing a first dielectric layer overlying the first conductor layer;
depositing a second conductor layer overlying the first dielectric layer to electrically contact the second electrode; and
depositing a third conductor layer overlying the first dielectric layer to electrically contact the third electrode,
wherein the devices are electrically connected in parallel by a combination of the first conductor layer, the second conductor layer, and the third conductor layer.

2. The method of claim 1 wherein the first electrode is a bottom electrode of the devices, the third electrode is a top electrode of the devices, and the second electrode is an intermediate electrode located vertically between the top electrode and the bottom electrode.

3. The method of claim 2 further comprising depositing a second dielectric layer over the second conductor layer, wherein the step of depositing the third conductor layer comprises depositing the third conductor layer over the second dielectric layer.

4. The method of claim 3 wherein the second electrode is offset from a midway point on the devices between the first electrode and the third electrode.

5. The method of claim 1 wherein the devices have a largest dimension less than 200 microns, and wherein the step of depositing the ink comprises printing the ink.

6. The process of claim 5 wherein the step of printing the ink comprises printing the ink by screen printing or flexography.

7. The process of claim 1 further comprising applying electrical signals to the first conductor layer, the second conductor layer, and the third conductor layer to operate the devices in parallel.

8. The process of claim 1 wherein the devices are transistors.

9. The process of claim 1 wherein the devices are one of MOSFETs, JFETs, or bipolar transistors.

10. The process of claim 1 wherein the second electrode and the third electrode are formed on a same plane on the device, and wherein the second conductor layer and the third conductor layer are formed on a same plane to contact the second electrode and third electrode, respectively.

11. The process of claim 10 wherein the devices include a feature that provides a rotational force to the devices while applying a field to the devices prior to curing the ink so that the devices are rotationally aligned with each other.

12. The process of claim 11 further comprising providing a mask over the substrate that exposes a portion of the first conductor layer, wherein the step of depositing the ink over the first conductor layer comprises depositing the ink to contact the first conductor layer exposed through the mask.

13. The process of claim 1 wherein the step of depositing the ink comprises depositing the ink in separate areas of the substrate, wherein the devices in each separate area are connected in parallel.

14. The process of claim 13 wherein the devices in at least one of the separate areas are interconnected with devices in at least one of other separate areas to form logic gates.

15. The process of claim 1 wherein the devices are formed to have a lower portion that is wider than an upper portion of the devices, the lower portion forming a shelf, wherein the second electrode is formed on the shelf.

16. The process of claim 1 wherein the substrate is flexible.

17. A circuit comprising:
a substrate having a first conductor layer;
a plurality of pre-formed, 3-terminal semiconductor electrical devices that have been mixed in a solution to form an ink and printed over the first conductor layer and cured, each of the devices having a first electrode, a second electrode, and a third electrode, wherein the first electrode of the devices is electrically connected to the first conductor layer;
a first dielectric layer overlying the first conductor layer;
a second conductor layer overlying the first dielectric layer to electrically contact the second electrode; and
a third conductor layer overlying the first dielectric layer to electrically contact the third electrode,
wherein the devices are electrically connected in parallel by a combination of the first conductor layer, the second conductor layer, and the third conductor layer.

18. The circuit of claim 17 wherein the first electrode is a bottom electrode of the devices, the third electrode is a top electrode of the devices, and the second electrode is an intermediate electrode located vertically between the top electrode and the bottom electrode.

19. The circuit of claim 18 wherein the devices are formed to have a lower portion that is wider than an upper portion of the devices, the lower portion forming a shelf, wherein the second electrode is formed on the shelf.

20. The circuit of claim 18 further comprising a second dielectric layer over the second conductor layer, wherein the third conductor layer is over the second dielectric layer.

21. The circuit of claim 20 wherein the second electrode is offset from a midway point on the devices between the first electrode and the third electrode.

22. The circuit of claim 17 wherein the devices have a largest dimension less than 200 microns.

23. The circuit of claim 17 wherein electrical signals are coupled to the first conductor layer, the second conductor layer, and the third conductor layer to operate the devices in parallel.

24. The circuit of claim 17 wherein the devices are transistors.

25. The circuit of claim 17 wherein the second electrode and the third electrode are formed on a same plane on the device, and wherein the second conductor layer and the third conductor layer are formed on a same plane to contact the second electrode and the third electrode, respectively.

26. The circuit of claim 17 wherein the devices are printed in separate areas of the substrate, wherein the devices in each separate area are connected in parallel.

27. The circuit of claim 26 wherein the devices in at least one of the separate areas are interconnected with devices in at least one of other separate areas to form logic circuits.

* * * * *